US012684696B2

(12) United States Patent
Kumbhat et al.

(10) Patent No.: US 12,684,696 B2
(45) Date of Patent: Jul. 14, 2026

(54) TRANSFER MOLDING SYSTEMS FOR SEMICONDUCTOR DEVICE PACKAGING

(71) Applicant: Apple Inc., Cupertino, CA (US)

(72) Inventors: Nitesh Kumbhat, San Jose, CA (US); Yanfeng Chen, San Ramon, CA (US); Mandar S. Painaik, Chandler, AZ (US); Shankar S. Pennathur, San Jose, CA (US); Pierpaolo Lupo, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 343 days.

(21) Appl. No.: 18/144,031

(22) Filed: May 5, 2023

(65) Prior Publication Data

US 2024/0074066 A1 Feb. 29, 2024

Related U.S. Application Data

(60) Provisional application No. 63/402,279, filed on Aug. 30, 2022.

(51) Int. Cl.
*H05K 3/28* (2006.01)
*H10W 74/01* (2026.01)

(52) U.S. Cl.
CPC .......... *H05K 3/284* (2013.01); *H10W 74/016* (2026.01); *H05K 2203/1316* (2013.01)

(58) Field of Classification Search
CPC ............................. H01L 25/565; H05K 3/284
See application file for complete search history.

(56) References Cited

U.S. PATENT DOCUMENTS

| | | | | |
|---|---|---|---|---|
| 4,096,228 A | * | 6/1978 | Decker ............. | B29C 45/14418 |
| | | | | 264/328.12 |
| 5,197,183 A | * | 3/1993 | Chia ................. | B29C 45/14655 |
| | | | | 257/E23.047 |
| 5,326,243 A | * | 7/1994 | Fierkens ........... | B29C 45/14655 |
| | | | | 264/272.17 |
| 5,578,261 A | * | 11/1996 | Manzione ........... | B29C 45/2669 |
| | | | | 264/272.17 |
| 5,923,959 A | * | 7/1999 | Mess ..................... | H01L 21/565 |
| | | | | 438/126 |
| 5,998,243 A | * | 12/1999 | Odashima ......... | B29C 45/14655 |
| | | | | 438/126 |
| 6,117,382 A | * | 9/2000 | Thummel ............. | H01L 21/565 |
| | | | | 264/272.17 |

(Continued)

FOREIGN PATENT DOCUMENTS

CN 103545224 A 1/2014

*Primary Examiner* — Andrew D Graham
(74) *Attorney, Agent, or Firm* — Sterne, Kessler, Goldstein & Fox P.L.L.C.

(57) ABSTRACT

Various embodiments of a mold cavity structure of a transfer molding system are disclosed. The transfer molding system includes a first mold-forming structure and a second mold-forming structure. The second mold-forming structure includes a mold cavity. The mold cavity includes a gate region, a component region, and a vent region. The component region is configured to enclose an electrical component. A volume of the vent region is adjustable. The transfer molding system further includes an inlet port coupled to the gate region and configured to direct a flow of a molding compound into the mold cavity during an operation of the transfer molding system.

20 Claims, 17 Drawing Sheets

(56)     References Cited

U.S. PATENT DOCUMENTS

| | | | | |
|---|---|---|---|---|
| 6,157,086 | A * | 12/2000 | Weber | H01L 24/28 |
| | | | | 257/E23.125 |
| 6,319,450 | B1 | 11/2001 | Chua et al. | |
| 6,403,009 | B1 * | 6/2002 | Saxelby, Jr. | H01L 21/565 |
| | | | | 264/272.17 |
| 6,413,801 | B1 * | 7/2002 | Lin | H01L 21/565 |
| | | | | 257/E23.125 |
| 6,589,820 | B1 * | 7/2003 | Bolken | H01L 21/565 |
| | | | | 264/272.17 |
| 6,656,773 | B2 * | 12/2003 | Boyaud | H01L 23/3128 |
| | | | | 257/E21.503 |
| 8,039,848 | B2 | 10/2011 | Loh et al. | |
| 8,198,141 | B2 * | 6/2012 | Ito | H01L 21/561 |
| | | | | 438/125 |
| 9,849,617 | B2 | 12/2017 | Huber | |
| 2006/0255435 | A1 * | 11/2006 | Fuergut | H01L 23/31 |
| | | | | 257/E23.125 |
| 2010/0013120 | A1 * | 1/2010 | Ho | B29C 45/561 |
| | | | | 264/272.11 |
| 2018/0194051 | A1 | 7/2018 | Suzuki | |
| 2019/0134866 | A1 * | 5/2019 | Wang | B29C 45/14065 |
| 2020/0303439 | A1 * | 9/2020 | Shimizu | H01L 24/48 |
| 2022/0250300 | A1 | 8/2022 | Gram | |

* cited by examiner

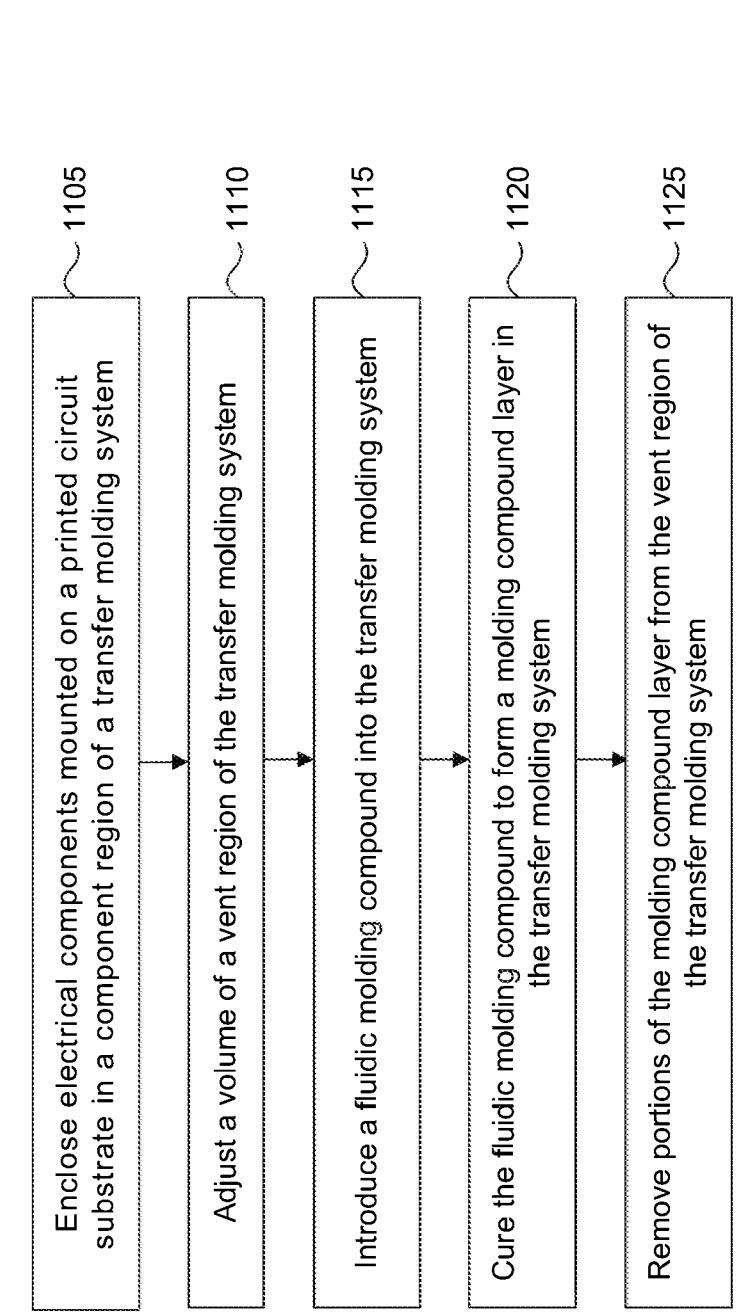

1100

1105   Enclose electrical components mounted on a printed circuit substrate in a component region of a transfer molding system 1110   Adjust a volume of a vent region of the transfer molding system 1115   Introduce a fluidic molding compound into the transfer molding system 1120   Cure the fluidic molding compound to form a molding compound layer in the transfer molding system 1125   Remove portions of the molding compound layer from the vent region of the transfer molding system

System or Device
1200

X
Y
Z

TRANSFER MOLDING SYSTEMS FOR SEMICONDUCTOR DEVICE PACKAGING

CROSS-REFERENCE TO RELATED APPLICATION

This application claims the benefit of U.S. Provisional Patent Application No. 63/402,279, filed Aug. 30, 2022, titled "Transfer Molding Systems for Semiconductor Device Packaging," which is incorporated by reference herein in its entirety.

FIELD

This disclosure relates to transfer molding systems and, more particularly, to mold-forming structures of transfer molding systems.

BACKGROUND

Transfer molding systems are used in the semiconductor industry for packaging electrical components, such as microprocessors, memory chips, integrated circuits, capacitors, resistors, and inductors, which can be mounted on printed circuit substrates. The transfer molding systems encapsulate the electronic components with molding compounds. The molding compound provides mechanical rigidity and reliability protection to the electronic components to prevent moisture and handling damage.

SUMMARY

Various embodiments of a mold-forming structure of a transfer molding system are disclosed. In some embodiments, the transfer molding system includes a first mold-forming structure and a second mold-forming structure. The second mold-forming structure includes a mold cavity. The mold cavity includes a gate region, a component region, and a vent region. The component region is configured to enclose an electrical component mounted on a substrate. A volume of the vent region is adjustable. The transfer molding system further includes an inlet port coupled to the gate region and configured to direct a flow of a molding compound into the mold cavity during an operation of the transfer molding system.

In some embodiments, a molding system includes a first mold-forming structure and a second mold-forming structure. The a second mold-forming structure includes a first component region configured to enclose an electrical component mounted on a substrate and a vent region having a channel region and first and second reservoir regions coupled to each other through the channel region. The first reservoir region is disposed on the substrate and overlapping with the first mold-forming structure The second reservoir region is non-overlapping with the substrate and the first mold-forming structure.

In some embodiments, a method includes enclosing an electrical component mounted on a substrate in a component region of a mold cavity of a molding system, adjusting a volume of a vent region of the mold cavity of the molding system, introducing a fluidic molding compound into the mold cavity, and curing the fluidic molding compound to form a molding compound layer in the mold cavity.

BRIEF DESCRIPTION OF THE DRAWINGS

Aspects of this disclosure are best understood from the following detailed description when read with the accompanying figures.

FIG. 11 is a flow diagram of a method for encapsulating electrical components mounted on printed circuit substrates with molding compound layers in a transfer molding system, in accordance with some embodiments.

Figure 1A:
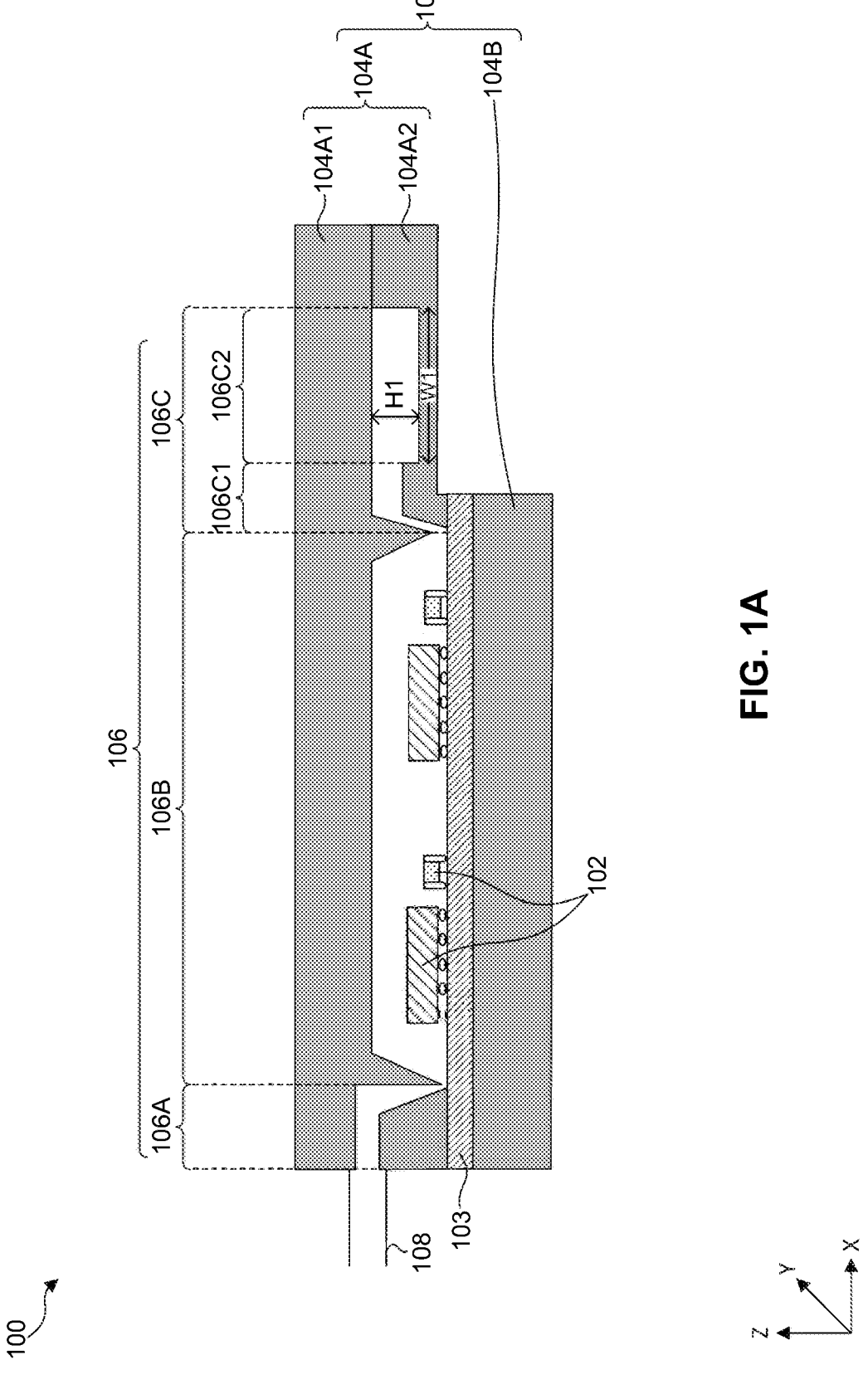
FIGS. 1A-1E illustrate cross-sectional views of a mold-forming structure of a transfer molding system at various stages of a transfer molding process, in accordance with some embodiments.

Illustrative embodiments will now be described with reference to the accompanying drawings. In the drawings, like reference numerals generally indicate identical, functionally similar, and/or structurally similar elements. The discussion of elements with the same annotations applies to each other, unless mentioned otherwise.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

Electronic devices, such as computers, mobile phones, cameras, watches, and tablets, include electrical components. These electrical components include microprocessors, memory chips, integrated circuits, capacitors, resistors, and inductors, which can be mounted on circuit substrates. Conductive layers can be patterned on the circuit substrates by printing ("printed circuit substrate"), plating ("plated circuit substrate"), etching ("etched circuit substrate"), or other suitable technologies to form conductive lines (e.g., metal traces), and bonding pads (e.g., solder pads) can be formed on the conductive lines. The bonding pads can be used to electrically connect the electrical components to the conductive lines and to other electrical components mounted on the printed circuit substrate, or any other suitable circuit substrate.

The electrical components mounted on the printed circuit substrates can be packaged (or encapsulated) with a molding compound (e.g., polymeric material) to provide mechanical stability to the electrical connections between the electrical components and the printed circuit substrates and to protect the electrical components from moisture. One of the methods of packaging (or encapsulating) the electrical components is through a transfer molding process in a transfer molding system.

The transfer molding system can include a bottom mold-forming structure, a top mold-forming structure, a fluid chamber, and a plunger coupled to the fluid chamber. The top mold-forming structure can include a mold cavity with a gate region, a component region, and a vent region. The gate region and the vent region can be on opposite sides of the component region. The fluid chamber can be coupled to the mold cavity and can hold the molding compound in the form of molding pellets, which are melted during the transfer molding process to form a fluidic molding compound. During the transfer molding process, the printed circuit substrate with the electrical components can be placed on the bottom mold-forming structure and a peripheral portion of the printed circuit substrate is compressed between the top and bottom mold-forming structures to enclose the electrical components in the component region of the mold cavity. After enclosing the electrical components, the plunger can drive the fluidic molding compound from the fluid chamber into the mold cavity through the gate region. The movement of the plunger can drive the fluidic molding compound to fill the mold cavity while flowing towards the vent region of the mold cavity. The fluidic molding compound can be cured to form the molding compound layer on the electrical components once the mold cavity is filled with the fluidic molding compound.

The vent region is disposed directly on the peripheral portion of the printed circuit substrate and provides additional space for the fluidic molding compound to flow past the electrical components so that air from the component region can be expelled while the fluidic molding compound fills the mold cavity. The presence of air in the fluidic molding compound on the electrical components can create unwanted voids in the cured molding compound layer.

The size and volume of the vent region is constrained by the limited space available on the printed circuit substrate, as increasing the printed circuit substrate increases the cost of packaging. The size constraints of the vent region results in flow paths of inadequate lengths for the fluidic molding compound to flow past the electrical components for a complete venting of air from the fluidic molding compound on the electrical components. Due to the inadequate lengths of the flow paths, the vent region can fill with the fluidic molding compound before all the air trapped (or voids) in the fluidic molding compound on the electrical components is transferred to the vent region. As the vent region fills with the fluidic molding compound, the flow of the fluidic molding compound substantially reduces or ceases in the mold cavity, thus leaving the voids in the fluidic molding compound on the electrical components.

The voids can negatively impact the mechanical stability and reliability of the electrical connections between the electrical components and the printed circuit substrates. The presence of voids can weaken the structural integrity of the molding compound layer and cause cracks in the packaging of the electrical components. Also, the presence of voids near solder pads can create bridging between adjacent solder pads of adjacent electrical components and create electrical shorts between adjacent electrical components. The bridging can be due to solder material of the solder pads reflowing through the voids to connect with adjacent solder pads during any subsequent temperature-based processing of the packaged electrical components. As a result, the presence of voids in the molding compound layer surrounding the electrical components can reduce the reliability and yield of the electrical component packages.

The present disclosure provides an example transfer molding system to prevent or minimize the formation of voids in molding compound layers formed on electrical components mounted on printed circuit substrates. In some embodiments, the transfer molding system can include a mold-forming structure with a top mold-forming structure and a bottom mold-forming structure. In some embodiments, the top mold-forming structure can include a mold cavity with a gate region, a component region, and a vent region. The gate region can be configured to receive a fluidic molding compound, and the component region can be configured to hold the electrical components, as discussed above.

In some embodiments, the vent region can be positioned away from and/or outside of the printed circuit substrate area to address the size and volume constraints placed on the vent region by the space occupied by the printed circuit substrate, as discussed above. By such placement of the vent region, the vent region can be configured to provide a larger space for the fluidic molding compound to flow into and keep the fluidic molding compound flowing for a longer period of time through the mold cavity compared to vent regions formed on the printed circuit substrates. In some embodiments, the vent region can include removable inserts and/or a piston to adjust the volume of the vent region, thus controlling the time period for flowing the fluidic molding compound through the mold cavity. In some embodiments, the vent region can be included in the bottom mold-forming structure. In some embodiments, the volume of the vent region can be about 5% to about 50% of the volume of the component region. In some embodiments, the vent region can have a vertical dimension (e.g., height) of about 0.2 mm to about 20 mm and a horizontal dimension (e.g., width) of about 1 mm to about 500 mm.

With such an enlarged and/or adjustable configuration of the vent region, substantially all air from the fluidic molding compound in the component region can be transferred to the vent region, thus preventing or minimizing the formation of voids in the molding compound layer formed on the electrical components. By preventing or minimizing the formation of voids, (i) the electrical components can be mounted at lower heights with smaller solder pads, thus reducing the height of the packaged electrical components, (ii) high temperature-based processes can be performed on the molded electrical components, such as surface mounting additional electrical components on an opposite side of the printed circuit substrate with high temperature solder pads, and (iii) the costly and time consuming capillary underfill process under the electrical components can be eliminated by using molding compound underfilling.

Figure 1B:
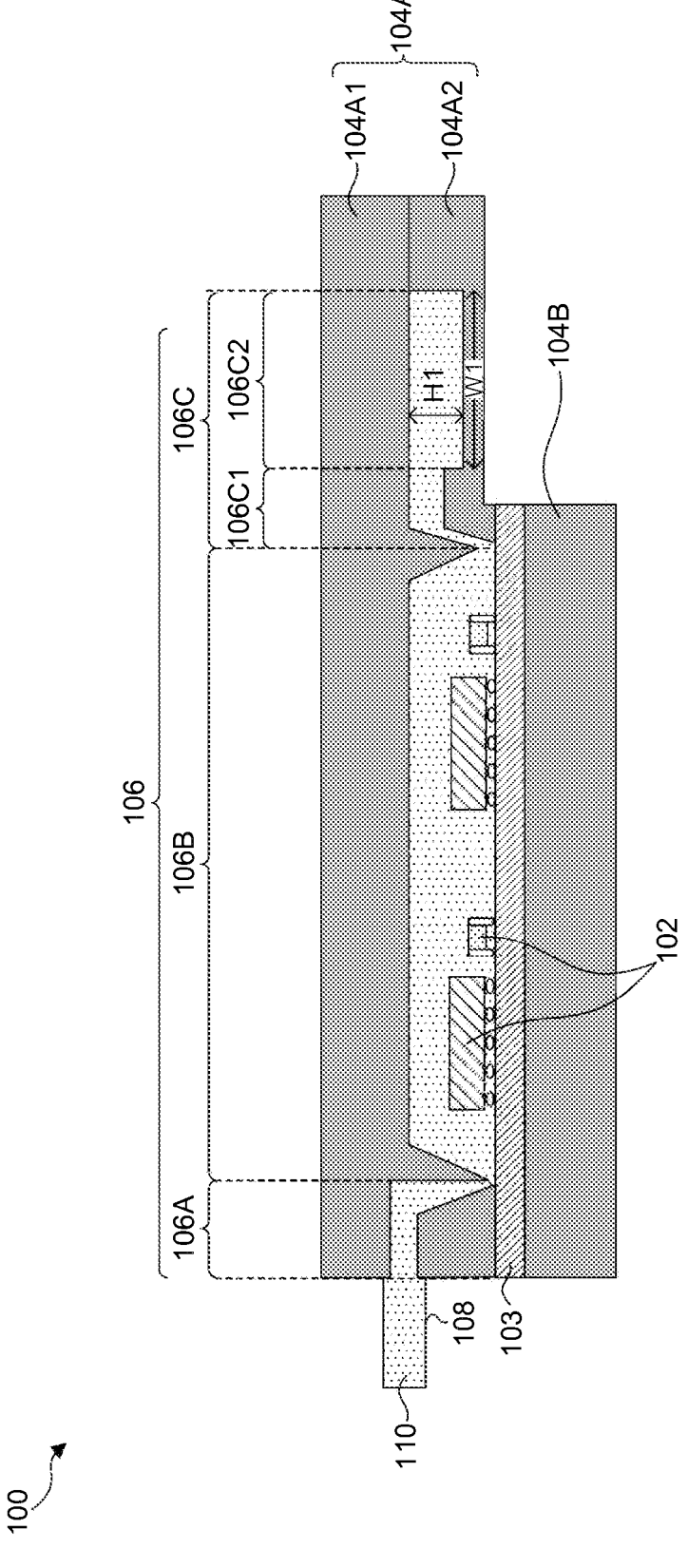
Figure 1C:
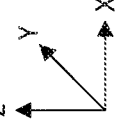
Figure 1D:
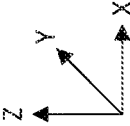
Figure 1E:
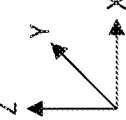

FIGS. 1A-1E illustrate cross-sectional views of a transfer molding system 100 at various stages of performing a transfer molding process to encapsulate electrical components 102 mounted on a printed circuit substrate 103 with a molding compound layer 112, according to some embodiments. FIG. 1A illustrates a cross-sectional view of transfer molding system 100 prior to the formation of molding compound layer 112. FIGS. 1B and 1C illustrate cross-sectional views of transfer molding system 100 during the formation of molding compound layer 112. FIGS. 1D and 1E illustrate cross-sectional views of transfer molding system 100 during the removal of portions of molding compound layer 112.

In some embodiments, transfer molding system 100 can include a mold-forming structure 104, which can include a top mold-forming structure 104A (also referred to as a "top chase 104A") and a bottom mold-forming structure 104B (also referred to as a "bottom chase 104B"). In some embodiments, top mold-forming structure 104A can include an upper structure 104A1 and a lower structure 104A2, which are detachable from each other. In some embodiments, top mold-forming structure 104A can further include a mold cavity 106, which can include a gate region 106A, a component region 106B, and a vent region 106C. In some embodiments, vent region 106C can include a channel region 106C1 and a reservoir region 106C2 (also referred to as a "reservoir chamber 106C2"), which can be connected to component region 106B through channel region 106C1. Gate region 106A and vent region 106C can be disposed between upper structure 104A1 and lower structure 104A2. Component region 106B can be disposed between upper structure 104A1 and printed circuit substrate 103. In some embodiments, printed circuit substrate 103 can be placed on bottom mold-forming structure 104B and a peripheral portion of printed circuit substrate 103 can be compressed between top mold-forming structure 104A and bottom mold-forming structure 104B to enclose electrical components 102 in component region 106B. In some embodiments, instead of printed circuit substrate 103, circuit substrate 103 can be plated circuit substrate 103, etched circuit substrate 103, or other suitable circuit substrates.

Transfer molding system 100 can further include a fluid chamber (not shown) and a plunger (not shown) coupled to an inlet port 108, which can be connected to gate region 106A. The fluid chamber can be configured to hold a molding compound in the form of molding pellets, which are melted during the transfer molding process to form a fluidic molding compound 110, shown in FIG. 1B. The plunger can be configured to drive fluidic molding compound 110 into mold cavity 106 through inlet port 108 along an X-axis direction, as shown in FIG. 1B. The movement of the plunger can keep fluidic molding compound 110 flowing through mold cavity 106 until vent region 106C is filled. In some embodiments, vent region 106C can have dimensions that provide adequate space to maintain the flow of fluidic molding compound 110 through mold cavity 106 until substantially all the air in component region 106B is transferred to vent region 106C.

In some embodiments, reservoir region 106C2 of vent region 106C can have a volume of about 5% to about 50% of a volume of component region 106B to provide adequate space for venting substantially all the air from component region 106B. In some embodiments, the adequate space can be provided by reservoir region 106C2 with a vertical dimension H1 of about 0.2 mm to about 20 mm and a horizontal dimension W1 (e.g., width W1) of about 1 mm to about 500 mm. In some embodiments, vertical dimension H1 (e.g., height H1) and horizontal dimension W1 can be of a portion of reservoir region 106C2 with the largest volume. In some embodiments, reservoir region 106C2 is not positioned directly on printed circuit substrate 103 and can be non-overlapping with printed circuit substrate 103. Reservoir region 106C2 can be vertically and horizontally displaced away from printed circuit substrate 103 by channel region 106C1 of vent region 106C. As a result, the dimensions of reservoir region 106C2 are not constrained by the surface area available on the peripheral regions of printed circuit substrate 103 and the cost of packaging can be reduced by reducing the dimensions of printed circuit substrate 103.

In some embodiments, after vent region 106C is filled with fluidic molding compound 110, the flow of fluidic molding compound 110 in mold cavity 106 can cease and fluidic molding compound 110 can be cured to form molding compound layer 112, as shown in FIG. 1C. The formation of molding compound layer 112 can be followed by the removal of portions of molding compound layer 112 that are formed outside component region 106B, such as the portions of molding compound layer 112 formed in gate region 106A, vent region 106C, and inlet port 108. To remove these portions of molding compound layer 112, upper structure 104A1 can be removed and the portions of molding compound layer 112 in inlet port 108, gate region 106A, and vent region 106C can be cut and discarded using a robotic arm 114, as shown in FIGS. 1D and 1E.

Figure 1F:
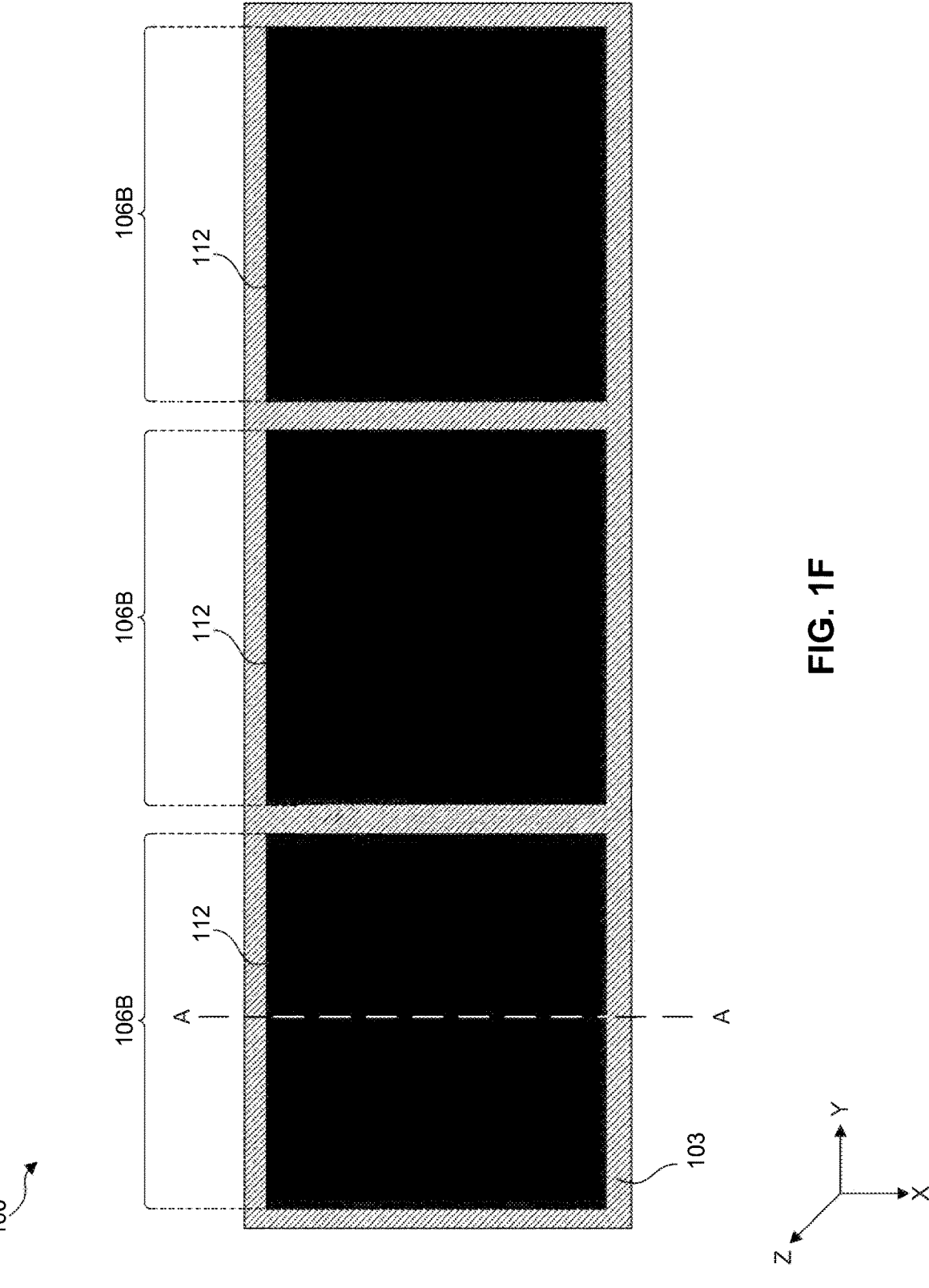
FIG. 1F illustrate a top-down view of molding compound layers formed on electrical components mounted on printed circuit substrates using a mold-forming structure of a transfer molding system, in accordance with some embodiments.

Though FIGS. 1A-1E show one mold cavity 106 in top mold-forming structure 104A, top mold-forming structure 104A can have an array of any number of mold cavities 106 along a Y-axis. For example, FIG. 1F illustrates a top-down view of an array of molding compound layers 112 formed in component regions 106B of an array of mold cavities 106 in top mold-forming structure 104A on printed circuit substrate 103. The top-down view is shown after the removal of portions of molding compound layers 112 formed in gate regions 106A, vent regions 106C, and inlet ports 108 in the array of mold cavities 106 of top mold-forming structure 104A. In some embodiments, the cross-sectional views of molding compound layer 112 in FIGS. 1D-1E can be along line A-A of FIG. 1F.

In some embodiments, the transfer molding system can have other configurations of vent region instead of vent region 106C, as illustrated in FIGS. 2-7.

Figure 2:
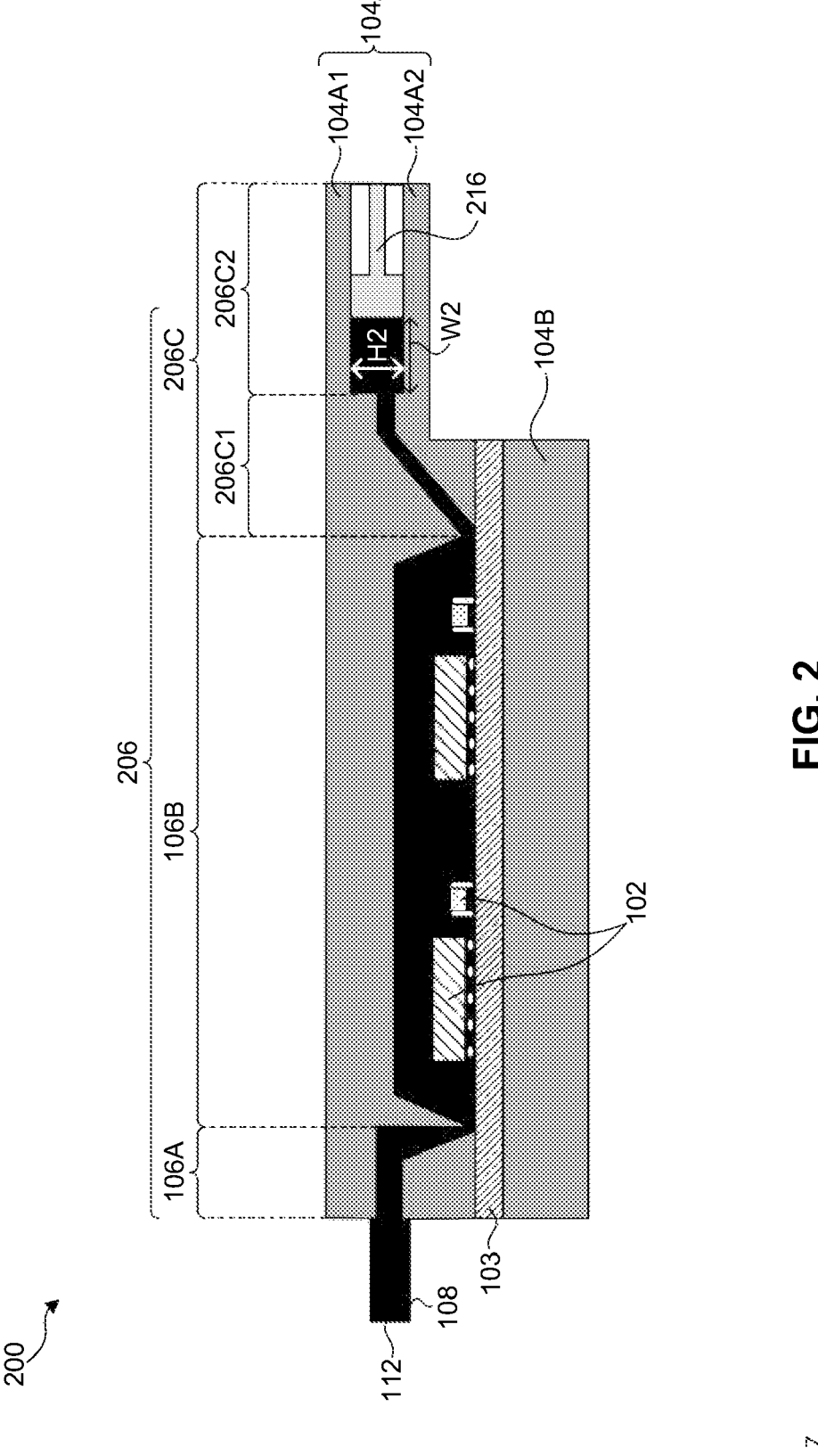
FIGS. 2-7 illustrate cross-sectional views of different mold-forming structures of transfer molding systems, in accordance with some embodiments.

FIG. 2 illustrates a cross-sectional view of a transfer molding system 200 after the formation of molding compound layer 112, according to some embodiments. The discussion of transfer molding system 100 applies to transfer molding system 200, unless mentioned otherwise. The discussion of elements in FIGS. 1A-1F and 2 with the same annotations applies to each other, unless mentioned otherwise. In some embodiments, top mold-forming structure 104A can include a mold cavity 206 with gate region 106A, component region 106B, and a vent region 206C. The discussion of vent region 106C applies to vent region 206C, unless mentioned otherwise. In some embodiments, vent region 206C can include a channel region 206C1 and a volume adjustable reservoir region 206C2, which can be connected to component region 106B through channel region 206C1. Vent region 206C can be disposed between upper structure 104A1 and lower structure 104A2.

In some embodiments, reservoir region 206C2 can include a piston 216 or a spring-loaded block 216 to control the volume of reservoir region 206C2. Piston 216 or spring-loaded block 216 can be laterally moved within reservoir region 206C2 to adjust width W2 of reservoir region 206C2 and consequently to adjust the volume of reservoir region 206C2. In some embodiments, piston 216 or spring loaded block 216 can be moved to adjust the volume of reservoir region 206C2 prior to introducing fluidic molding compound 110 into mold cavity 206 and/or during the flow of fluidic molding compound 110 through mold cavity 206. Adjustable volume of reservoir region 206C2 can provide flexibility for transfer molding process development and optimization so that the desired volume size for reservoir region 206C2 can be selected for adequate venting of substantially all the air from component region 106B. In some embodiments, width W2 can be adjusted to be about 0.2 mm to about 20 mm and/or the volume of reservoir region 206C2 can be adjusted to be about 5% to about 50% of the volume of component region 106B. In some embodiments, reservoir region 206C2 can have a height H2 of about 1 mm to about 500 mm. Within these ranges of width W2, height H2, and/or volume of reservoir region 206C2, adequate volume size can be provided by reservoir region 206C2 for venting substantially all the air from component region 106B.

Figure 3:
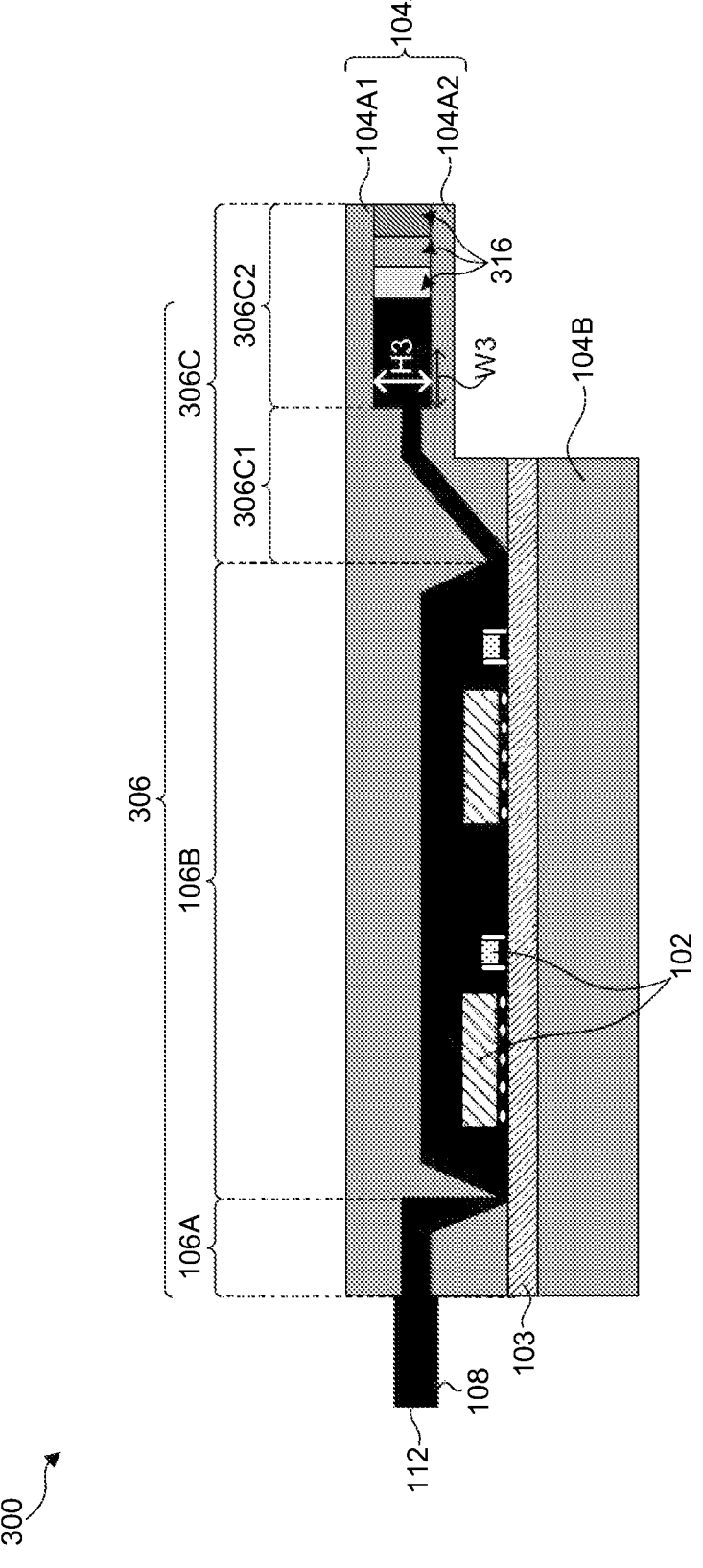

FIG. 3 illustrates a cross-sectional view of a transfer molding system 300 after the formation of molding compound layer 112, according to some embodiments. The discussion of transfer molding system 200 applies to transfer molding system 300, unless mentioned otherwise. The discussion of elements in FIGS. 1A-1F and 2-3 with the same annotations applies to each other, unless mentioned otherwise. In some embodiments, top mold-forming structure 104A can include a mold cavity 306 with gate region 106A, component region 106B, and a vent region 306C. The discussion of vent region 106C and 206C applies to vent region 306C, unless mentioned otherwise. In some embodiments, vent region 306C can include a channel region 306C1 and a volume adjustable reservoir region 306C2, which can be connected to component region 106B through channel region 306C1. Vent region 306C can be disposed between upper structure 104A1 and lower structure 104A2.

In some embodiments, reservoir region 306C2 can include one or more inserts 316 or metallic blocks 316 to adjust the volume of reservoir region 306C2, instead of piston 216 or spring-loaded block 216 of reservoir region 206C2 shown in FIG. 2. Inserts 316 or metallic blocks 316 can be introduced into reservoir region 306C2 to adjust width W3 of reservoir region 306C2 and consequently to adjust the volume of reservoir region 306C2. In some embodiments, inserts 316 or metallic blocks 316 can be inserted into reservoir region 306C2 prior to introducing fluidic molding compound 110 into mold cavity 206 and/or during the flow of fluidic molding compound 110 through mold cavity 206. In some embodiments, the number of inserts 316 or metallic blocks 316 can be selected based on the desired volume size of reservoir region 306C2 for adequate venting of substantially all the air from component region 106B. In some embodiments, width W3 can be adjusted to be about 0.2 mm to about 20 mm and/or the volume of reservoir region 306C2 can be adjusted to be about 5% to about 50% of the volume of component region 106B. In some embodiments, reservoir region 306C2 can have a height H3 of about 1 mm to about 500 mm. Within these ranges of width W3, height H3, and/or volume of reservoir region 306C2, adequate volume size can be provided by reservoir region 306C2 for venting substantially all the air from component region 106B.

Figure 4:
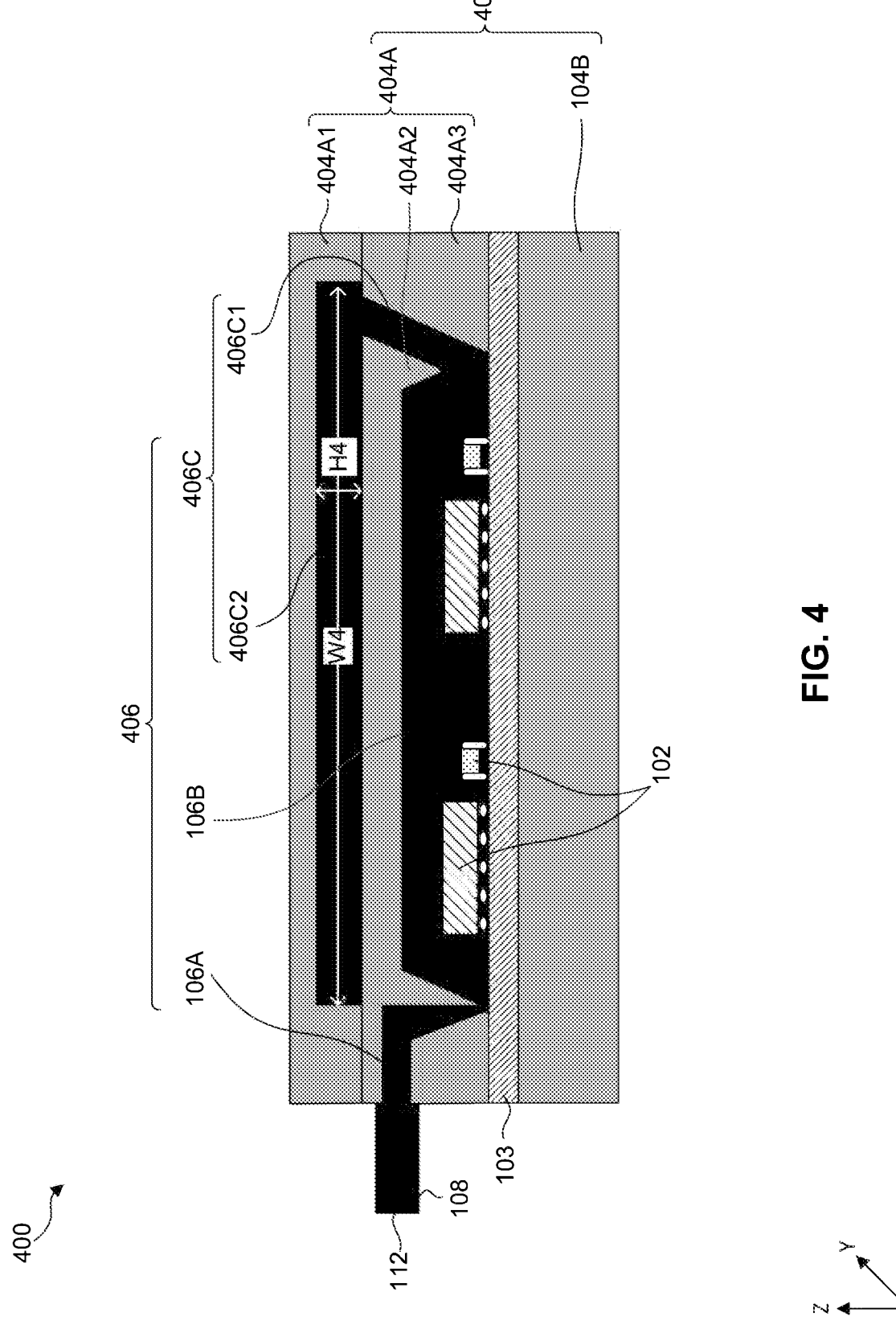

FIG. 4 illustrates a cross-sectional view of a transfer molding system 400 after the formation of molding compound layer 112, according to some embodiments. The discussion of transfer molding system 100 applies to transfer molding system 400, unless mentioned otherwise. The discussion of elements in FIGS. 1A-1F and 4 with the same annotations applies to each other, unless mentioned otherwise. In some embodiments, transfer molding system 400 can include a mold-forming structure 404, which can include a top mold-forming structure 404A and bottom mold-forming structure 104B. In some embodiments, top mold-forming structure 404A can include an upper structure 404A1, a middle structure 404A2, and a lower structure 404A3, which are detachable from each other. In some embodiments, top mold-forming structure 404A can further include a mold cavity 406, which can include gate region 106A, component region 106B, and a vent region 406C. In some embodiments, vent region 406C can include a channel region 406C1 and a reservoir region 406C2, which can be connected to component region 106B through channel region 406C1. Gate region 106A and channel region 406C1 can be disposed between middle structure 404A2 and lower structure 404A3. Reservoir region 406C2 can be disposed between upper structure 404A1 and middle structure 404A2. Component region 106B can be disposed between middle structure 404A2 and printed circuit substrate 103.

In some embodiments, reservoir region 406C2 can be disposed above component region 106B and separated from component region 106B by middle structure 404A2. Reservoir region 406C2 may not extend outside of printed circuit substrate 103 and overlap with printed circuit substrate 103, unlike reservoir regions 106C2, 206C2, and 306C2 discussed above. The placement of reservoir region 406C2 above component region 106B can provide a more compact top molding structure 404A. In some embodiments, reservoir region 406C2 can have a horizontal dimension greater than that of component region 106B for adequate venting of air from component region 106B. In some embodiments, reservoir region 406C2 can have a volume of about 5% to about 50% of a volume of component region 106B to provide the adequate space for venting substantially all the air from component region 106B. In some embodiments, the adequate space can be provided by reservoir region 406C2 with a height H4 of about 0.2 mm to about 20 mm and a width W4 of about 1 mm to about 500 mm.

Similar to upper structure 104A1 of top mold-forming structure 104A shown in FIGS. 1D and 1E, upper structure 404A1 can be removed to cut and discard portions of molding compound layer 112 from reservoir region 406C2. After the removal of portions of molding compound layer 112 from reservoir region 406C2, middle structure 404A2 can be removed to cut and discard portions of molding compound layer 112 from gate region 106A, channel region 406C1, and inlet port 108.

Figure 5:
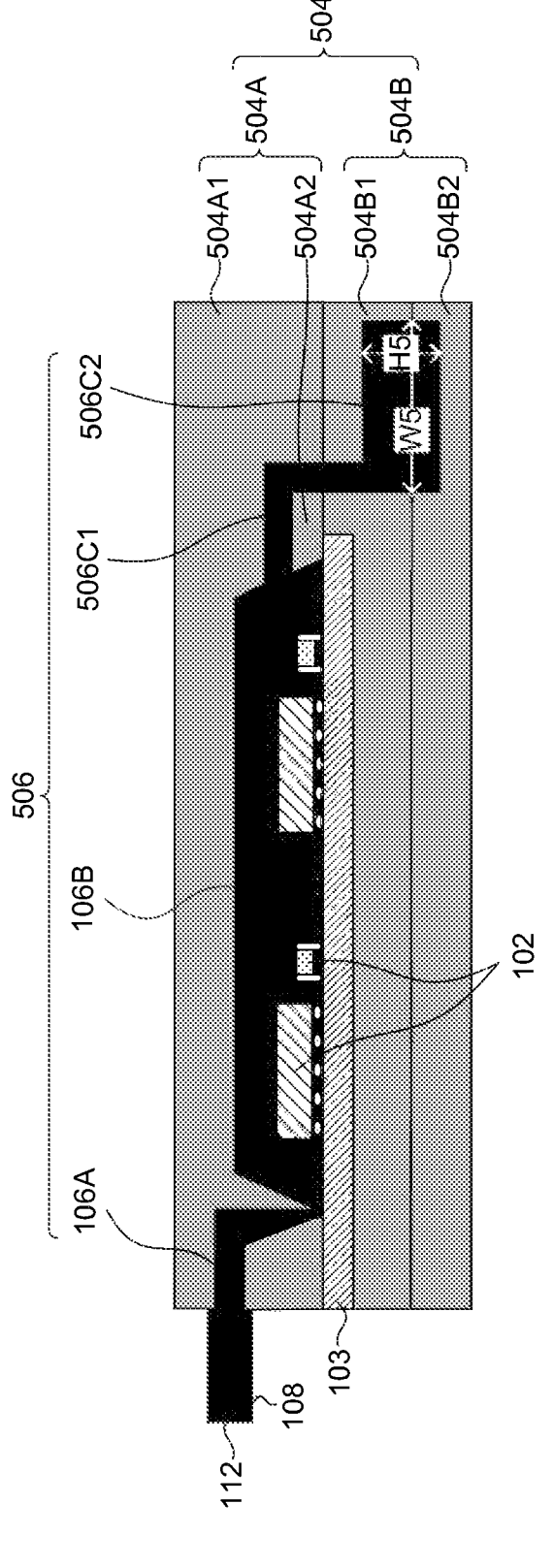

FIG. 5 illustrates a cross-sectional view of a transfer molding system 500 after the formation of molding compound layer 112, according to some embodiments. The discussion of transfer molding system 100 applies to transfer molding system 500, unless mentioned otherwise. The discussion of elements in FIGS. 1A-1F and 2-5 with the same annotations applies to each other, unless mentioned otherwise. In some embodiments, transfer molding system 500 can include a mold-forming structure 504, which can include a top mold-forming structure 504A and a bottom mold-forming structure 504B. In some embodiments, mold-forming structure 504 can further include a mold cavity 506, which can include gate region 106A, component region 106B, and a vent region 506C. In some embodiments, vent region 506C can include a channel region 506C1 and a reservoir region 506C2, which can be connected to component region 106B through channel region 506C1. A first portion of channel region 506C1 can be disposed in top mold-forming structure 504A and a second portion of channel region 506C1 can be disposed in bottom mold-forming structure 504B. The second portion of channel region 506C1 can be directly connected to reservoir region 506C2, which can be disposed in bottom mold-forming structure 504B. The first portion of channel region 506C1 in top mold-forming structure 504A can be referred to as a vent region of top mold-forming structure 504A. The second portion of channel region 506C1 in bottom mold-forming structure 504B and reservoir region 506C2 together can be referred to as a vent region of bottom mold-forming structure 504B.

In some embodiments, top mold-forming structure 504A can include an upper structure 504A1 and a lower structure 504A2, which are detachable from each other. Similarly, in some embodiments, bottom mold-forming structure 504B can include an upper structure 504B1 and a lower structure 504B2, which are detachable from each other. Gate region 106A and the first portion of channel region 506C1 can be disposed between upper structure 504A1 and lower structure 504A2. Component region 106B can be disposed between upper structure 504A1 and printed circuit substrate 103. The second portion of channel region 506C1 and reservoir region 506C2 can be disposed between upper structure 504B1 and lower structure 504B2.

Reservoir region 506C2 is not positioned directly on printed circuit substrate 103 and can be vertically and horizontally displaced away from printed circuit substrate 103 by channel region 506C1. Though reservoir region 506C2 is shown to extend away from printed circuit substrate 103 along an X-axis, reservoir region 506C2 can also extend under printed circuit substrate 103 to provide adequate volume for venting substantially all the air from component region 106B, as discussed above. In some embodiments, reservoir region 506C2 can have a volume of about 5% to about 50% of a volume of component region 106B. In some embodiments, reservoir region 506C2 can have a height H5 of about 0.2 mm to about 20 mm and a width W5 of about 1 mm to about 500 mm. Within these ranges of width W5, height H5, and/or volume of reservoir region 506C2, adequate volume size can be provided by reservoir region 506C2 for venting substantially all the air from component region 106B.

Similar to upper structure 104A1 of top mold-forming structure 104A shown in FIGS. 1D and 1E, upper structure 504A1 can be removed to cut and discard portions of molding compound layer 112 from gate region 106A, the first portion of channel region 406C1, and inlet port 108. Similarly, lower structure 504B2 can be removed to cut and discard portions of molding compound layer 112 from the first portion of channel region 406C1 and reservoir region 506C2.

Figure 6:
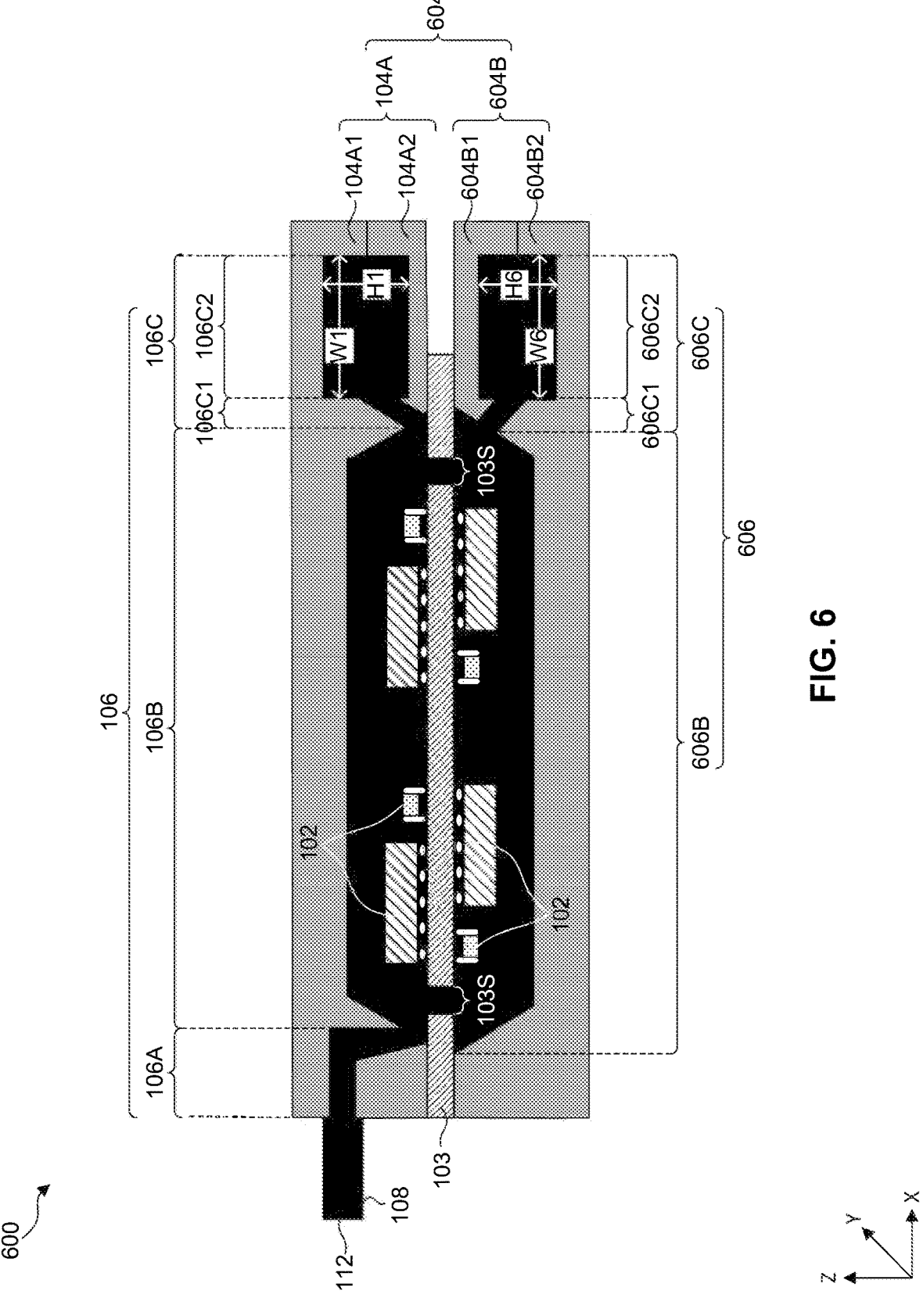

Though FIGS. 1A-1E and 2-5 show molding compound layer 112 encapsulating electrical components 102 mounted on one side of printed circuit substrate 103, molding compound layer 112 can be formed in transfer molding system to encapsulate electrical components 102 mounted on both sides of printed circuit substrate 103, as shown in FIG. 6. FIG. 6 illustrates a cross-sectional view of a transfer molding system 600 after the formation of molding compound layer 112 on electrical components 102 mounted on both sides of printed circuit substrate 103, according to some embodiments. The discussion of transfer molding system 100 applies to transfer molding system 600, unless mentioned otherwise. The discussion of elements in FIGS. 1A-1F and 2-6 with the same annotations applies to each other, unless mentioned otherwise.

In some embodiments, transfer molding system 600 can include a mold-forming structure 604, which can include top mold-forming structure 104A and a bottom mold-forming structure 604B. Similar to top mold-forming structure 104A, bottom mold-forming structure 604B can include an upper structure 604B1 and a lower structure 604B2, which are detachable from each other. Bottom mold-forming structure 604B can further include a mold cavity 606, which can include a component region 606B and a vent region 606C. Similar to vent region 106C, vent region 606C can include a channel region 606C1 and a reservoir region 606C2, which can be connected to component region 606B through channel region 606C1. The discussion of vent region 106C applies to vent region 606C, unless mentioned otherwise. Vent region 606C can be disposed between upper structure 604B1 and lower structure 604B2. Component region 606B can be disposed between upper structure 604B1 and a back-side of printed circuit substrate 103. A peripheral portion of printed circuit substrate 103 can be compressed between top mold-forming structure 104A and bottom mold-forming structure 604B to enclose electrical components 102 in component regions 106B and 606B.

The transfer molding process in transfer molding system 600 can be similar to that described in transfer molding system 100 with reference to FIGS. 1A-1F, except in transfer molding system 600 fluidic molding compound 110 can flow through slots 103S in printed circuit substrate 103 to fill component region 606B and vent region 606C. Similar to reservoir region 106C2, reservoir region 606C2 can provide the adequate space for venting substantially all the air from component region 606B during the transfer molding process. In some embodiments, reservoir region 606C2 can have a volume of about 5% to about 50% of a volume of component region 606B. In some embodiments, reservoir region 606C2 can have a height H6 of about 0.2 mm to about 20 mm and a width W6 of about 1 mm to about 500 mm. Within these ranges of width W6, height H6, and/or volume of reservoir region 606C2, adequate volume size can be provided by reservoir region 606C2 for venting substantially all the air from component region 606B. Furthermore, similar to the transfer molding process described with reference to FIGS. 1A-1F, lower structure 604B2 of bottom mold-forming structure 604B can be removed to cut and discard portions of molding compound layer 112 from vent region 606C.

In some embodiments, vent regions 106C and 606C can include reservoir regions similar to reservoir region 206C2 of FIG. 2 or reservoir region 306C2 of FIG. 3, instead of reservoir regions 106C2 and 606C2.

In some embodiments, the vent regions of the transfer molding systems can include additional reservoir regions directly on surface area in the peripheral regions of printed circuit substrate 103 that are not used by electrical components 102. Such configuration of vent regions can utilize the unused space on printed circuit substrate 103 to provide additional space for the flow of fluidic molding compound 110 during the transfer molding process, discussed above. Such a transfer molding system with additional reservoir region on printed circuit substrate 103 is illustrated in FIG. 7.

Figure 7:
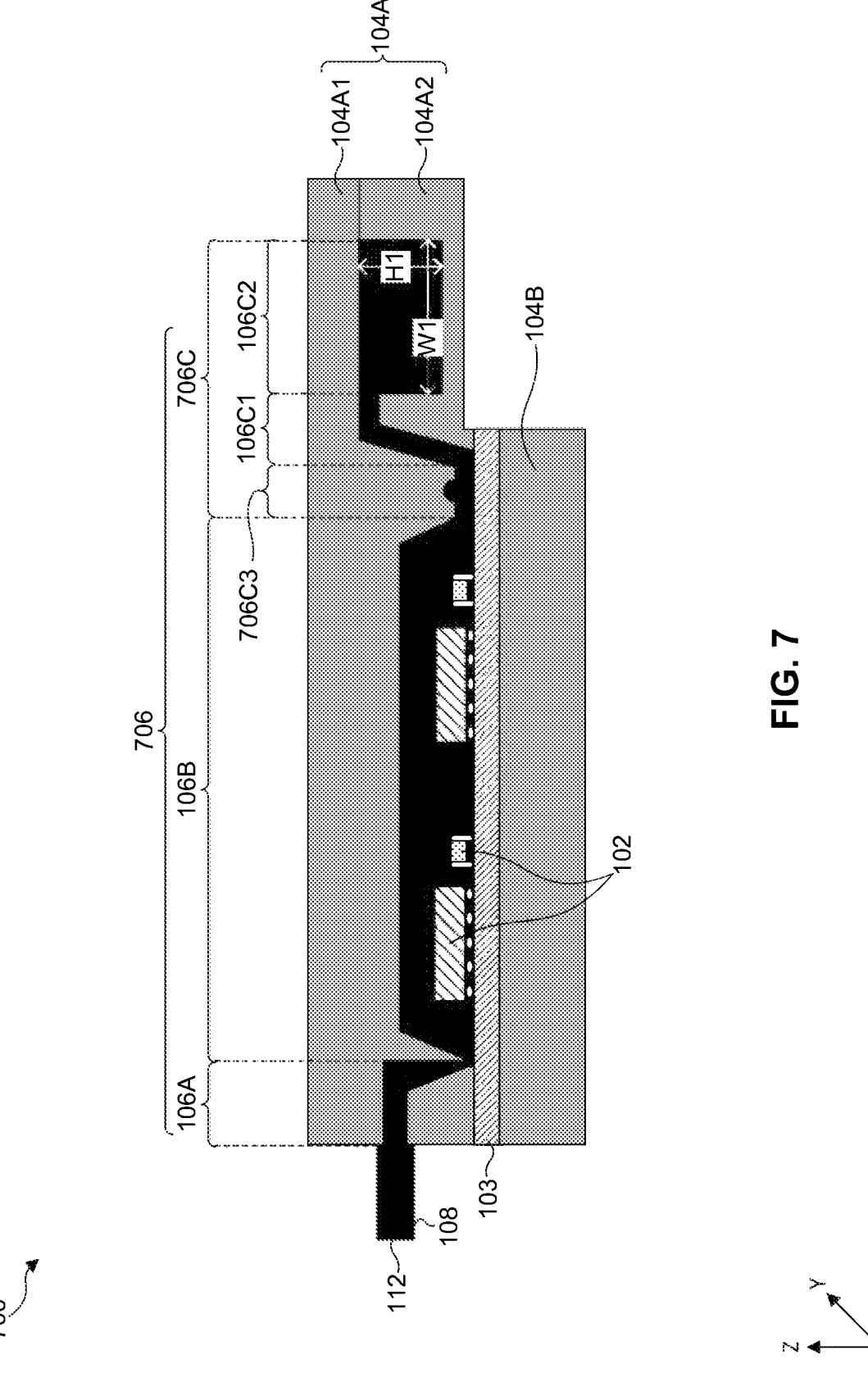

FIG. 7 illustrates a cross-sectional view of a transfer molding system 700 after the formation of molding compound layer 112, according to some embodiments. The discussion of transfer molding system 100 applies to transfer molding system 700, unless mentioned otherwise. The discussion of elements in FIGS. 1A-1F and 2-7 with the same annotations applies to each other, unless mentioned otherwise. Transfer molding system 700 is similar to transfer molding system 100, except transfer molding system 700 has reservoir region 706C3 in addition to reservoir region 106C2 in vent region 706C of mold cavity 706. The discussion of vent region 106C applies to vent region 706C, unless mentioned otherwise. Reservoir region 706C3 can be disposed directly on a surface area in the peripheral region of printed circuit substrate 103 between component region 106B and channel region 106C1. The two reservoir regions 106C2 and 706C3 can be connected to each other through channel region 106C1. In some embodiments, the volume size of reservoir region 106C2 can be greater than that of reservoir region 706C3.

In some embodiments, an additional reservoir region similar to reservoir region 706C3 can also be included on printed circuit substrate 103 (i) between channel region 206C1 and component region 106B of FIG. 2, (ii) between channel region 306C1 and component region 106B of FIG. 3, (iii) between channel region 406C1 and component region 106B of FIG. 4, (iv) between channel region 506C1 and component region 106B of FIG. 5, (v) between channel region 106C1 and component region 106B of FIG. 6, and (vi) between channel region 606C1 and component region 606B of FIG. 6.

Though FIG. 7 shows the additional reservoir region 706C3 to be disposed directly on one of the peripheral sides of printed circuit substrate 103, transfer molding system 700 can have (i) additional reservoir regions disposed directly on other peripheral sides of printed circuit substrate 103 along an X-axis, and/or (ii) additional reservoir regions disposed directly on unused surface area of printed circuit substrate 103 between adjacent component regions 106B, according to some embodiments.

Figure 8:
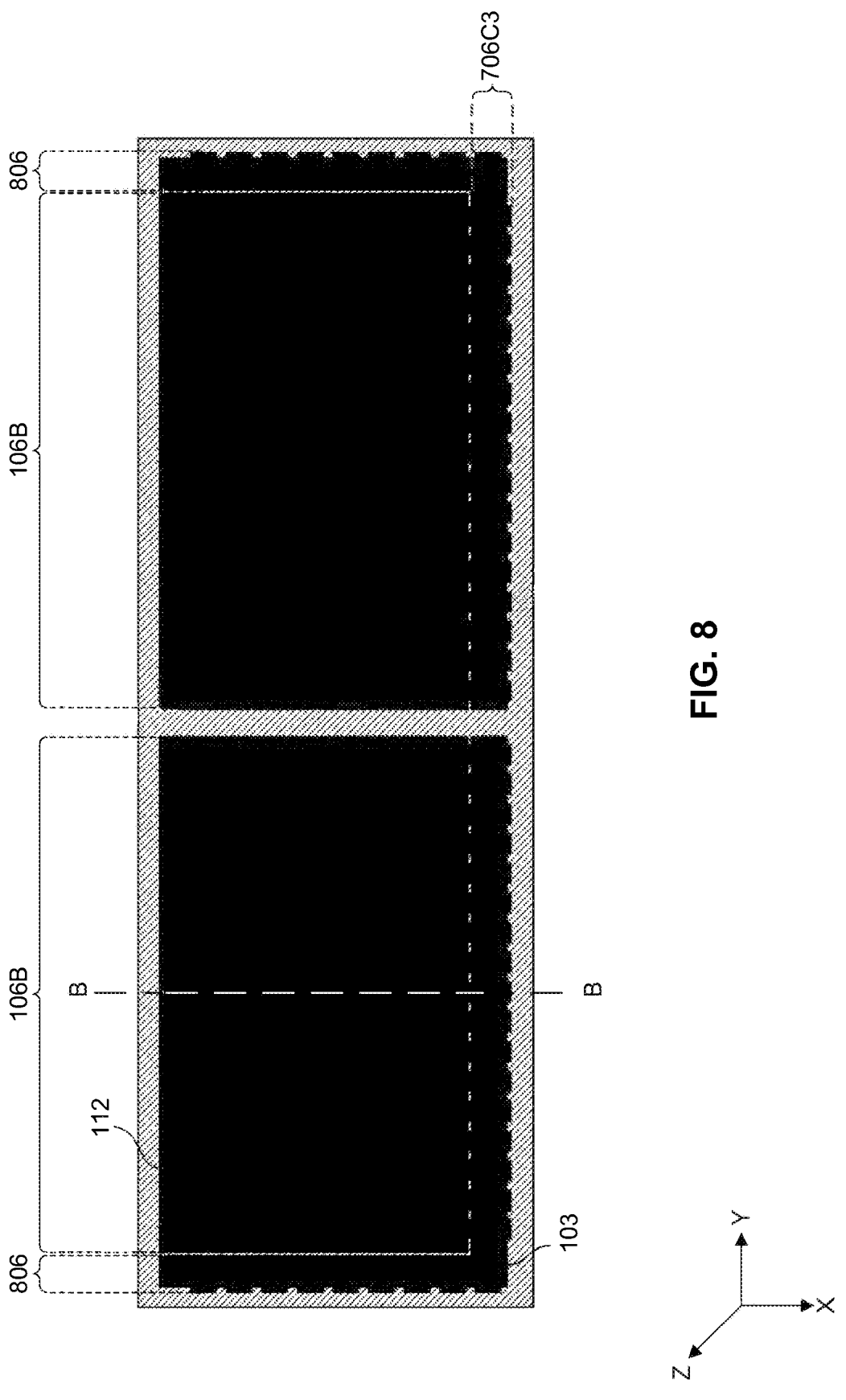
FIGS. 8-10 illustrate top-down views of different molding compound layers formed on electrical components mounted on printed circuit substrates using different mold-forming structures of transfer molding systems, in accordance with some embodiments.

In some embodiments, vent region 706C of transfer molding system 700 can include reservoir regions 806 disposed directly on the peripheral side of printed circuit substrate 103 along an X-axis in addition to reservoir region 706C3, as described with reference to FIG. 8. The positional arrangement of reservoir regions 706C3 and 806 on printed circuit substrate 103 is illustrated in FIG. 8 through the positional arrangement of molding compound layers 112 formed in these reservoir regions 706C3 and 806. FIG. 8 illustrates a top-down view of an array of molding compound layers 112 formed in component regions 106B and reservoir regions 706C3 and 806 in an array of mold cavities 706 of transfer molding system 700, according to some embodiments. The top-down view of FIG. 8 is shown after the removal of portions of molding compound layers 112 formed in gate regions 106A, channel regions 106C1, reservoir regions 106C2, and inlet ports 108 in the array of mold cavities 706. In some embodiments, the cross-sectional view of molding compound layer 112 in FIG. 7 can be along lines B-B of FIG. 8.

Figure 9:
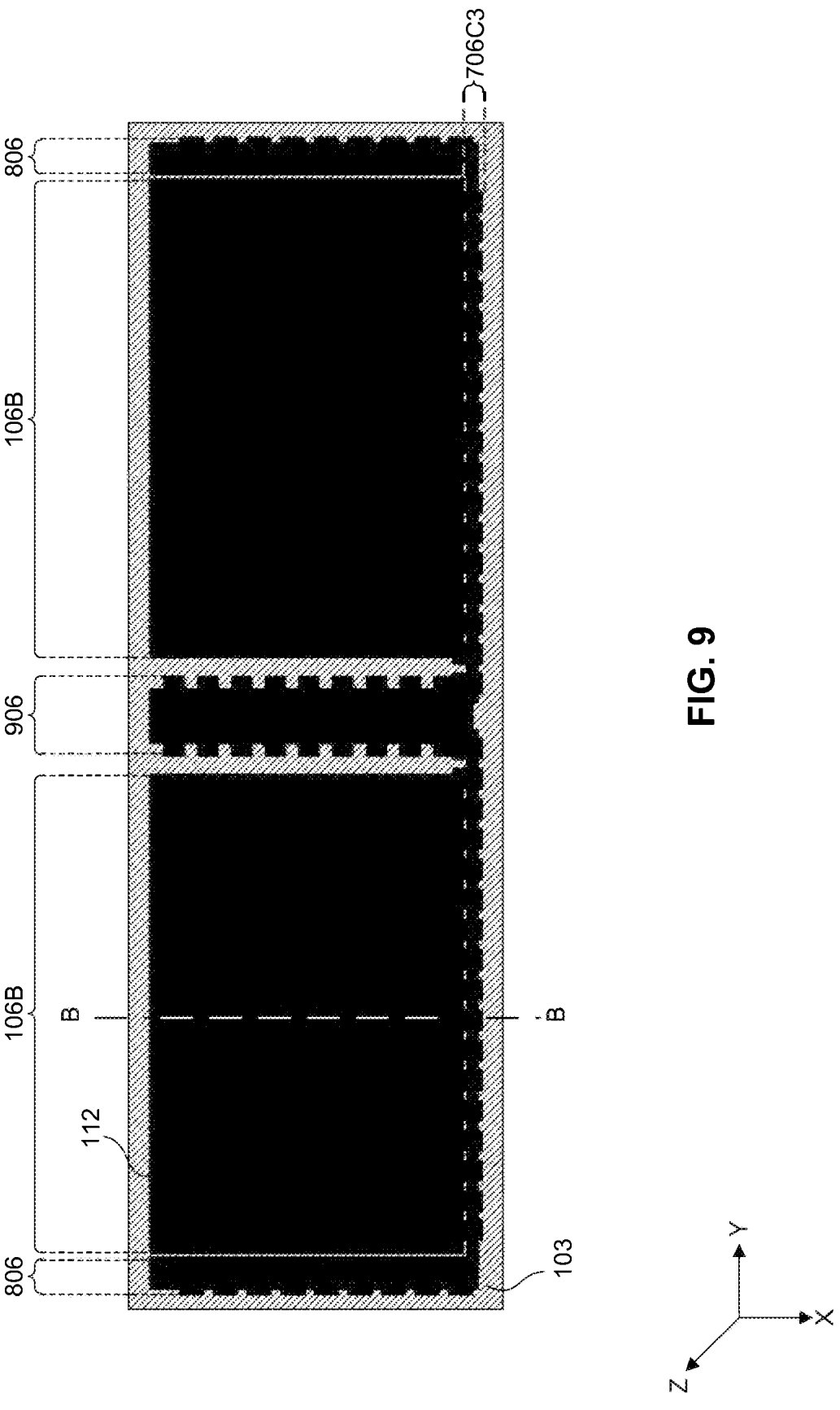
Figure 10:
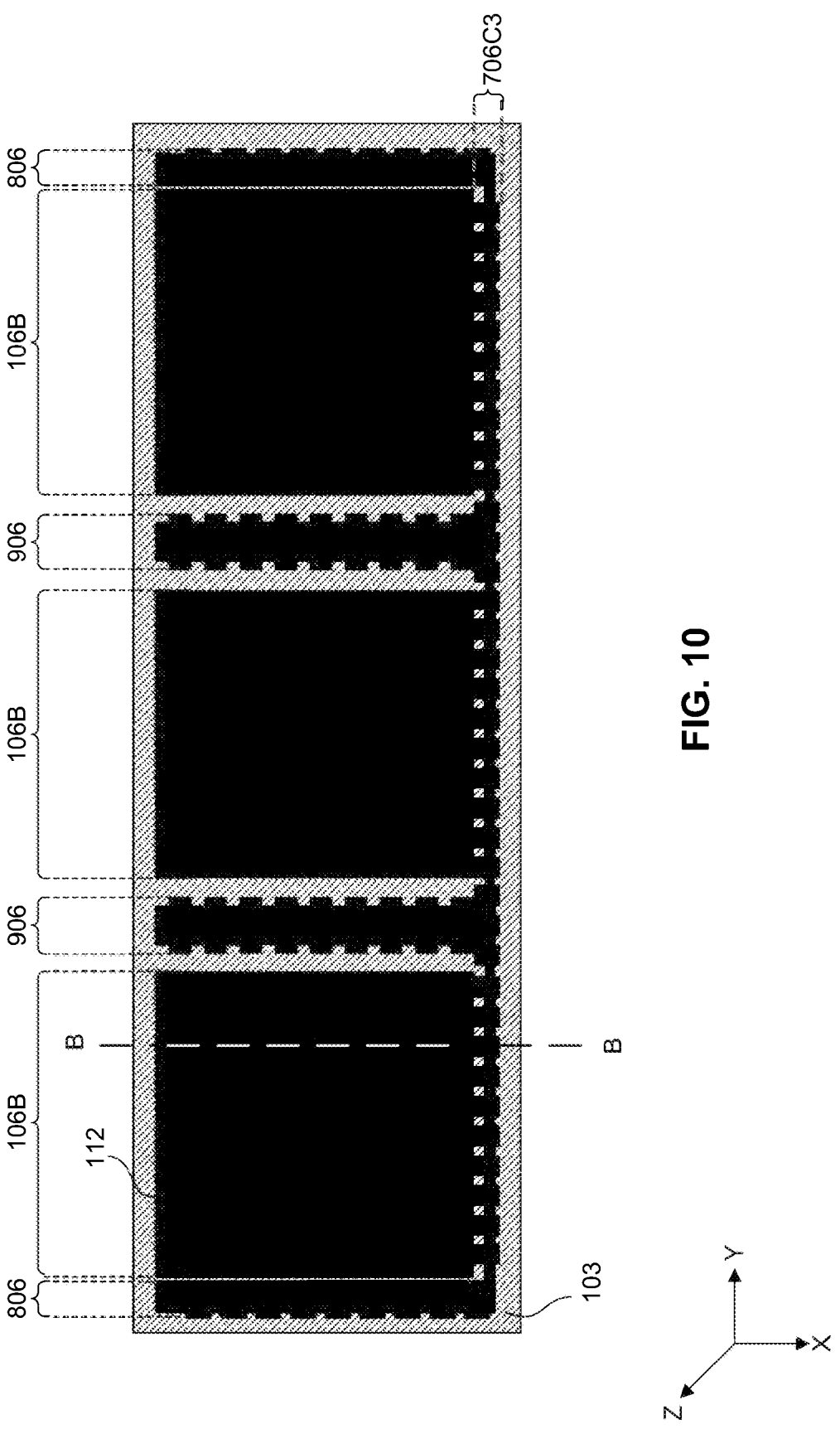

In some embodiments, vent region 706C of transfer molding system 700 can include reservoir regions 906 disposed directly on unused regions of printed circuit substrate 103 between adjacent component regions 106B in addition to reservoir region 706C3 and 806, as described with reference to FIGS. 9 and 10. The positional arrangement of reservoir regions 706C3, 806, and 906 on printed circuit substrate 103 is illustrated in FIGS. 9 and 10 through the positional arrangement of molding compound layers 112 formed in these reservoir regions 706C3, 806, and 906. FIGS. 9 and 10 illustrates top-down views of arrays of molding compound layers 112 formed in component regions 106B and reservoir regions 706C3, 806, and 906 in arrays of mold cavities 706 of transfer molding system 700, according to some embodiments. The top-down views of FIGS. 9 and 10 are shown after the removal of portions of molding compound layers 112 formed in gate regions 106A, channel regions 106C1, reservoir regions 106C2, and inlet ports 108 in the arrays of mold cavities 706. In some embodiments, the cross-sectional view of molding compound layer 112 in FIG. 7 can be along lines B-B of FIGS. 9 and 10.

FIG. 11 is a flow diagram of an example method 1100 for encapsulating electrical components 102 mounted on printed circuit substrate 103 with molding compound layer 112 in transfer molding systems 200 and 300 shown in FIGS. 2 and 3, respectively, according to some embodiments. For illustrative purposes, the operations illustrated in FIG. 11 will be described with reference to FIGS. 1A-1E, 2, and 3. Operations can be performed in a different order or not performed depending on specific applications. It should be noted that additional processes can be provided before, during, and after method 1100, and that some other processes may only be briefly described herein.

In operation 1105, electrical components mounted on a printed circuit substrate are enclosed in a component region of a transfer molding system. For example, as shown in FIG. 1A, electrical components mounted on printed circuit substrate 103 can be placed on bottom mold-forming structure 104B and a peripheral portion of printed circuit substrate 103 can be compressed between top mold-forming structure 104A and bottom mold-forming structure 104B of transfer molding systems 200 and 300 to enclose electrical components 102 in component regions 106B of transfer molding systems 200 and 300.

Referring to FIG. 11, in operation 1110, a volume of a vent region of the transfer molding system is adjusted. For example, as shown in FIG. 2, a volume of reservoir region 206C2 can be adjusted by laterally moving piston 216 or spring-loaded block 216. Similarly, as shown in FIG. 3, a volume of reservoir region 306C2 can be adjusted by inserting one or more inserts 316 or metallic blocks 316 into reservoir region 306C2.

Referring to FIG. 11, in operation 1115, a fluidic molding compound is introduced into the transfer molding system. For example, as shown in FIG. 1B, fluidic molding compound 110 can be introduced into mold cavities 206 and 306 of transfer molding systems 200 and 300, respectively, through inlet ports 108 along an X-axis direction. Fluidic molding compound 110 can be kept flowing through mold cavities 206 and 306 until vent regions 206C and 306, respectively, are filled. In some embodiments, the volume of reservoir regions 206C2 and 306C2 can be re-adjusted during the flow of fluidic molding compound 110 for adequate venting of substantially all the air from component regions 106B of transfer molding systems 200 and 300.

Referring to FIG. 11, in operation 1120, the fluidic molding compound is cured to form a molding compound layer in the transfer molding system. For example, as shown in FIGS. 2 and 3, fluidic molding compound 110 is cured to form molding compound layers 112 in mold cavities 206 and 306 of transfer molding systems 200 and 300, respectively.

Referring to FIG. 11, in operation 1125, portions of the molding compound layer can be removed from the vent region of the transfer molding system. For example, portions of molding compound layers 112 is be removed from vent regions 206 and 306 along with inlet ports 108 and gate regions 106A of transfer molding systems 200 and 300. The removal of these portions of molding compound layers 112 can include (i) removing piston 216 and inserts 316, (ii) removing upper structures 104A1 to expose molding compound layers 112 in mold cavities 206 and 306, and (iii) cutting the portions of molding compound layers 112 in inlet ports 108, gate regions 106A, and vent regions 206 and 306.

Figure 12:
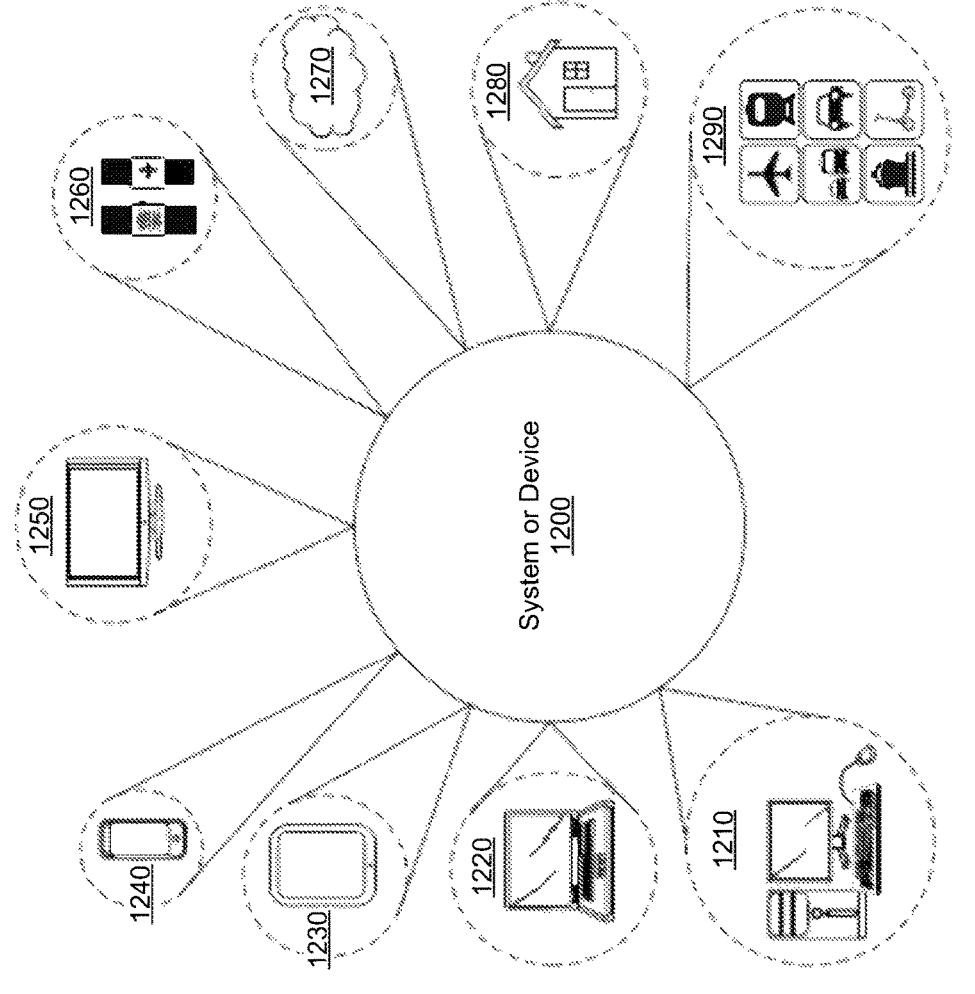
FIG. 12 illustrates exemplary systems or devices that can include electrical components encapsulated with molding compound layers formed using different mold-forming structures of a transfer molding system, in accordance with some embodiments.

FIG. 12 is an illustration of exemplary systems or devices that can include the packaged or encapsulated electrical components formed using the disclosed embodiments. System or device 1200 can incorporate one or more of the packaged or encapsulated electrical components formed using the disclosed embodiments in a wide range of areas. For example, system or device 1200 can be implemented in one or more of a desktop computer 1210, a laptop computer 1220, a tablet computer 1230, a cellular or mobile phone 1240, and a television 1250 (or a set-top box in communication with a television).

Also, system or device 1200 can be implemented in a wearable device 1260, such as a smartwatch or a health-monitoring device. In some embodiments, the smartwatch can have different functions, such as access to email, cellular service, and calendar functions. Wearable device 1260 can also perform health-monitoring functions, such as monitoring a user's vital signs and performing epidemiological functions (e.g., contact tracing and providing communication to an emergency medical service). Wearable device 1260 can be worn on a user's neck, implantable in user's body, glasses or a helmet designed to provide computer-generated reality experiences (e.g., augmented and/or virtual reality), any other suitable wearable device, and combinations thereof.

Further, system or device 1200 can be implemented in a server computer system, such as a dedicated server or on shared hardware that implements a cloud-based service 1270. System or device 1200 can be implemented in other electronic devices, such as a home electronic device 1280 that includes a refrigerator, a thermostat, a security camera, and other suitable home electronic devices. The interconnection of such devices can be referred to as the "Internet of Things" (IoT). System or device 1200 can also be implemented in various modes of transportation 1290, such as part of a vehicle's control system, guidance system, and/or entertainment system. The systems and devices illustrated in FIG. 12 are merely examples and are not intended to limit future applications of the disclosed embodiments. Other example systems and devices that can implement the disclosed embodiments include portable gaming devices, music players, data storage devices, and unmanned aerial vehicles.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

Unless stated otherwise, the specific embodiments are not intended to limit the scope of claims that are drafted based on this disclosure to the disclosed forms, even where only a single example is described with respect to a particular feature. The disclosed embodiments are thus intended to be illustrative rather than restrictive, absent any statements to the contrary. The application is intended to cover such alternatives, modifications, and equivalents that would be apparent to a person skilled in the art having the benefit of this disclosure.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A molding system, comprising:
a first mold-forming structure;
a second mold-forming structure comprising a mold cavity, wherein:
  the mold cavity comprises a gate region, a component region, and a vent region,
  the component region is configured to enclose an electrical component mounted on a substrate,
  the vent region comprises:
    a channel region overlapping with the first mold-forming structure, and
    a reservoir region non-overlapping with the first mold-forming structure, and
  a volume of the vent region is adjustable; and
an inlet port coupled to the gate region and configured to direct a flow of a molding compound into the mold cavity during an operation of the molding system.

2. The molding system of claim 1, wherein the second mold-forming structure further comprises a piston or a spring-loaded box disposed in the vent region and configured to adjust the volume of the vent region.

3. The molding system of claim 1, wherein second mold-forming structure further comprises removable inserts disposed in the vent region and configured to adjust the volume of the vent region.

4. The molding system of claim 1, wherein the reservoir region is coupled to the component region through the channel region.

5. The molding system of claim 1, wherein the second mold-forming structure further comprises a piston, a spring-loaded box, or removable inserts disposed in the reservoir region; and wherein a width of the reservoir region is adjustable with the piston, the spring-loaded box, or the removable inserts.

6. The molding system of claim 1, wherein the reservoir region is non-overlapping with the substrate.

7. The molding system of claim 1, wherein the reservoir region is disposed below the substrate.

8. The molding system of claim 1, wherein the reservoir region comprises a volume of about 5% to about 50% of a volume of the component region.

9. The molding system of claim 1, wherein the first mold-forming structure comprises an other vent region coupled to the vent region of the second mold-forming structure, and wherein the other vent region is non-overlapping with the substrate.

10. The molding system of claim 1, wherein the first mold-forming structure comprises an other mold cavity with an other component region and an other vent region.

11. A molding system, comprising:

a first mold-forming structure;

a second mold-forming structure comprising a cavity, wherein the cavity comprises:

a gate region, a component region adjacent to the gate region and configured to enclose an electrical component mounted on a substrate, and a vent region comprising a channel region positioned on the substrate and an adjustable reservoir region; and an inlet port coupled to the gate region and configured to direct a flow of a molding compound into the cavity.

12. The molding system of claim 11, wherein the adjustable reservoir region comprises a piston, a spring-loaded box, or removable inserts.

13. The molding system of claim 11, wherein the adjustable reservoir region is non-overlapping with the substrate.

14. The molding system of claim 11, wherein the adjustable reservoir region comprises a volume of about 5% to about 50% of a volume of the component region.

15. The molding system of claim 11, wherein the channel region is positioned between the component region and the adjustable reservoir region.

16. The molding system of claim 11, wherein the cavity further comprises a reservoir region on the substrate and positioned between the component region and the channel region.

17. A molding system, comprising:

a first mold-forming structure on a first side of a substrate;

a second mold-forming structure comprising a cavity, wherein the cavity comprises:

a gate region on a second side of the substrate, a component region configured to enclose an electrical component mounted on the second side of the substrate, and a vent region comprising an adjustable reservoir region non-overlapping with the substrate and a non-adjustable reservoir region overlapping with the substrate; and an inlet port coupled to the gate region and configured to direct a flow of a molding compound into the cavity.

18. The molding system of claim 17, wherein the first mold-forming structure comprises an other cavity with an other component region and an other vent region.

19. The molding system of claim 17, wherein the adjustable reservoir region comprises a piston, a spring-loaded box, or removable inserts.

20. The molding system of claim 17, wherein the vent region further comprises a channel region positioned on the second side of the substrate.

* * * * *